(12) United States Patent
Motika et al.

(10) Patent No.: US 9,857,422 B2
(45) Date of Patent: *Jan. 2, 2018

(54) METHODS AND SYSTEMS FOR GENERATING FUNCTIONAL TEST PATTERNS FOR MANUFACTURE TEST

(71) Applicant: International Business Machines Corporation, Armonk, NY (US)

(72) Inventors: Franco Motika, Hopewell Junction, NY (US); John D. Parker, Fishkill, NY (US); Gerard M. Salem, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/063,692

(22) Filed: Mar. 8, 2016

(65) Prior Publication Data

US 2017/0261554 A1  Sep. 14, 2017

(51) Int. Cl.
- *G01R 31/317* (2006.01)
- *G01R 31/28* (2006.01)
- *G01R 31/3177* (2006.01)

(52) U.S. Cl.
CPC ... *G01R 31/31704* (2013.01); *G01R 31/2834* (2013.01); *G01R 31/3177* (2013.01)

(58) Field of Classification Search
CPC ............ G01R 31/3016; G01R 31/3177; G01R 31/2831; G01R 31/31704
See application file for complete search history.

(56) References Cited

U.S. PATENT DOCUMENTS

| | | | | |
|---|---|---|---|---|
| 5,425,036 A | * | 6/1995 | Liu | G06F 17/5027 714/725 |
| 7,640,476 B2 | * | 12/2009 | Watkins | G01R 31/3016 714/738 |

(Continued)

OTHER PUBLICATIONS

List of IBM Patents or Patent Applications Treated as Related; (Appendix P), Filed May 2, 2016; 2 pages.

(Continued)

*Primary Examiner* — Shelly A Chase
(74) *Attorney, Agent, or Firm* — Cantor Colburn LLP; Margaret A McNamara

(57) ABSTRACT

Embodiments include methods, computer systems and computer program products for generating functional test patterns for diagnostics, characterization and manufacture test. Aspects include: receiving from a system designer, via a design verification tool module, certain verification sequences configured to verify system functional design, executing the verification sequences received at a functional exerciser module against a device to generate various traces, capturing traces generated in emulation compatible format, processing traces captured via trace processor module, including parsing the traces captured, verifying data integrity of the traces captured, and summarizing statistics of the traces captured, generating, via an emulated pattern generator module, a predetermined number of emulated test patterns having tester independent format 'streams' of data compatible with a device test port based on output of the trace processor module, and processing, via a tester specific post-processor module, the emulated test patterns to generate functional test patterns using a tester specific post-processor module.

13 Claims, 3 Drawing Sheets

(56) References Cited

U.S. PATENT DOCUMENTS

| | | |
|---|---|---|
| 2001/0010091 A1 | 7/2001 | Noy |
| 2002/0091979 A1 | 7/2002 | Cook et al. |
| 2004/0225973 A1 | 11/2004 | Johnson |
| 2013/0227367 A1* | 8/2013 | Czamara ............ G01R 31/3177 714/735 |

OTHER PUBLICATIONS

Viitesh A. Agrawal et al., "Performing System Functional Test on a Chip Having Partial-Good Portions", U.S. Appl. No. 15/063,666, filed Mar. 8, 2016.

Viitesh Agrawal et al., "Methods and Systems for Performing Test and Calibration of Integrated Sensors", U.S. Appl. No. 15/063,731, filed Mar. 8, 2016.

* cited by examiner

METHODS AND SYSTEMS FOR GENERATING FUNCTIONAL TEST PATTERNS FOR MANUFACTURE TEST

BACKGROUND

The present disclosure relates generally to chip manufacturing, and more particularly to methods, systems and computer program products for generating functional test patterns for diagnostics, characterization and manufacture test.

The generation of effective functional test patterns is a difficult and complex problem encountered at device final test. These functional test patterns need to be equivalent to system exercisers executed in a system mission mode environment. Final tests are a critical step to ensure system design verification, functionality and acceptable device quality level at system integration.

The rapid densification of VLSI devices, incorporating complex functions operating at extreme circuit performance, has driven designs towards integrating many diverse functional macros or cores within these large chips. These macros range from autonomous processor cores with large cache arrays occupying relatively large portions of the chip's real estate, to a multitude of small arrays used as register stacks, trace arrays, content addressable memories, phase locked loops (PLL), and many other special purpose logic functions. These highly integrated circuit functions, in conjunction with state-of-the-art semiconductor technology advances, results in several test and diagnostic problems that have driven the generation of functional test patterns toward system equivalent functional test execution. The functional test patterns need to be used during manufacturing final tests of the device on a generic automatic test equipment (ATE) system, and these functional test patterns need to effectively emulate the execution of functional exercisers in a system mission equivalent environment.

Therefore, heretofore unaddressed needs still exist in the art to address the aforementioned deficiencies and inadequacies.

SUMMARY

In an embodiment of the present invention, a method for generating functional test patterns for diagnostics, characterization and manufacture test may include: receiving from a system designer, via a design verification tool module of an automatic functional test pattern generation (FTPG) system, a predetermined number of verification sequences configured to verify system functional design, executing the verification sequences received at a functional exerciser module of the FTPG system against a device to generate a number of traces, capturing the traces generated via a trace processor module of the FTPG system in an emulation compatible format, processing, via the trace processor module, the traces captured, the processing including parsing the traces captured, verifying data integrity of the traces captured, and summarizing statistics of the traces captured, generating, via an emulated pattern generator module of the FTPG system, a predetermined number of emulated test patterns having tester independent format 'streams' of data compatible with a device test port based on output of the trace processor module, and processing, via a tester specific post-processor module of an automatic test equipment (ATE) system, the emulated test patterns to generate functional test patterns using the tester specific post-processor module of the ATE system.

In another embodiment of the present invention, a computer system for generating functional test patterns for diagnostics, characterization and manufacture test may include a memory having computer executable instructions; and a processor for executing the computer executable instructions. When the computer executable instructions are executed at the processor, the computer executable instructions cause the computer system to perform: receiving from a system designer, via a design verification tool module of a functional test pattern generation (FTPG) system, a predetermined number of verification sequences configured to verify system functional design, executing the verification sequences received at a functional exerciser module of the FTPG system against a device to generate a number of traces, capturing the traces generated via a trace processor module of the FTPG system in an emulation compatible format, processing, via the trace processor module, the traces captured, the processing including parsing the traces captured, verifying data integrity of the traces captured, and summarizing statistics of the traces captured, generating, via an emulated pattern generator module of the FTPG system, a predetermined number of emulated test patterns having tester independent format 'streams' of data compatible with a device test port based on output of the trace processor module, and processing, via a tester specific post-processor module of the ATE system, the emulated test patterns to generate functional test patterns using the tester specific post-processor module of the ATE system.

In yet another embodiment of the present invention, a non-transitory computer readable storage medium may store computer executable instructions. When the computer executable instructions are executed by a processor of a computer system, the computer executable instructions cause the computer system to perform: receiving from a system designer, via a design verification tool module of an automatic FTPG system, a predetermined number of verification sequences configured to verify system functional design, executing the verification sequences received at a functional exerciser module of the FTPG system against a device to generate a number of traces, capturing the traces generated via a trace processor module of the FTPG system in an emulation compatible format, processing, via the trace processor module, the traces captured, the processing including parsing the traces captured, verifying data integrity of the traces captured, and summarizing statistics of the traces captured, generating, via an emulated pattern generator module of the FTPG system, a predetermined number of emulated test patterns having tester independent format 'streams' of data compatible with a device test port based on output of the trace processor module, and processing, via a tester specific post-processor module of the ATE system, the emulated test patterns to generate functional test patterns using a tester specific post-processor module of the ATE system.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
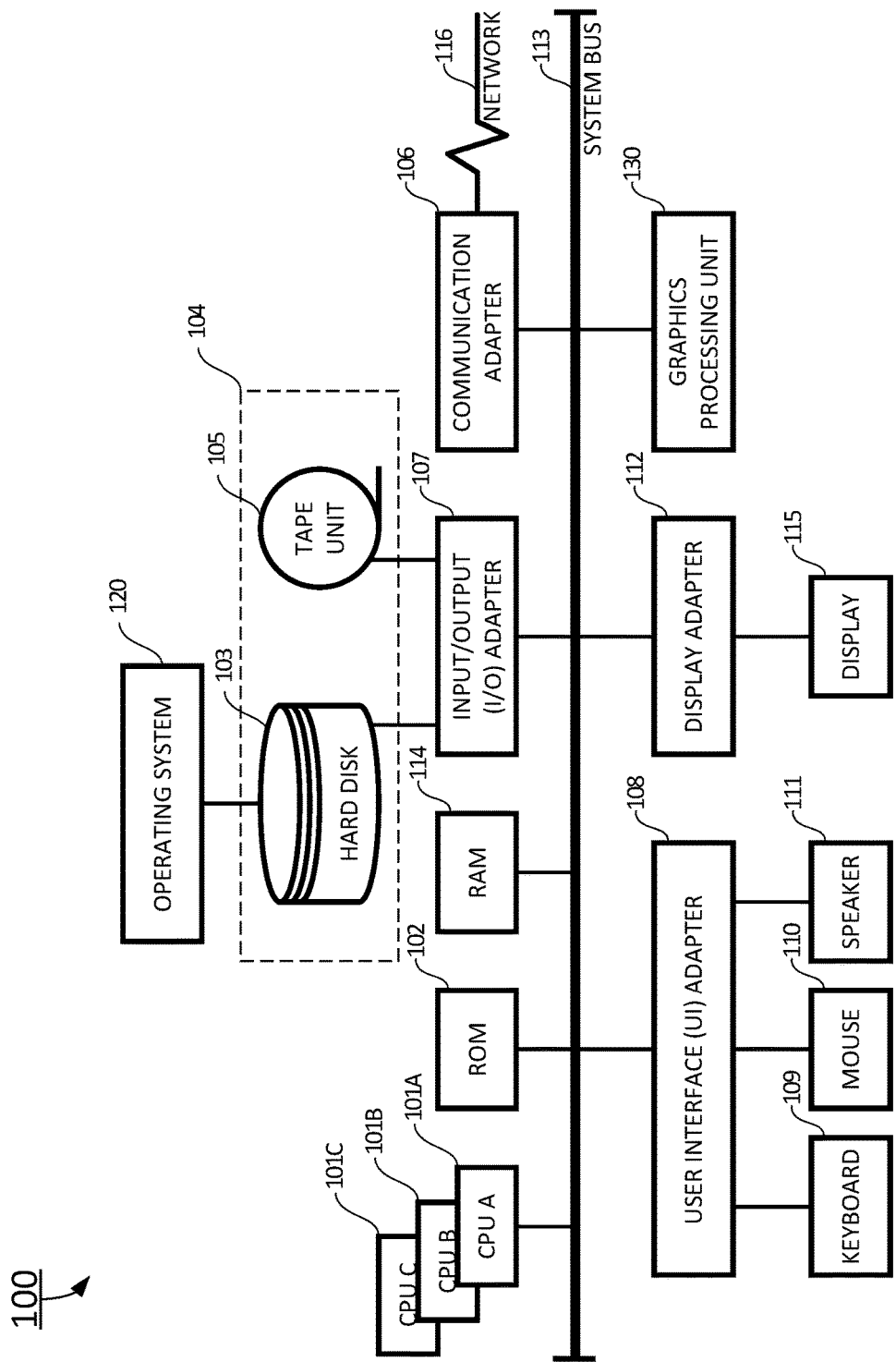
FIG. 1 is a block diagram illustrating an exemplary computer system for generating functional test patterns for diagnostics, characterization and manufacture test according to certain embodiments of the present invention.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term computer program, as used above, may include software, firmware, and/or microcode, and may refer to programs, routines, functions, classes, and/or objects. The term shared, as used above, means that some or all code from multiple modules may be executed using a single (shared) processor.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-3, in which certain exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

Referring to FIG. 1, an embodiment of a computer system 100 for generating functional test patterns for diagnostics, characterization and manufacture test and implementing the teachings herein. In this embodiment, the computer system 100 has one or more central processing units (processors) 101A, 101B, 101C, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of the computer system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the computer system 100 may be stored in mass storage 104. A network adapter 106 interconnects bus 113 with an outside network 116 enabling the computer system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the computer system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the computer system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. In certain embodiments, the network 116 may include symmetric multiprocessing (SMP) bus, a Peripheral Component Interconnect (PCI) bus, local area network (LAN), wide area network (WAN), telecommunication network, wireless communication network, and the Internet.

Figure 2:
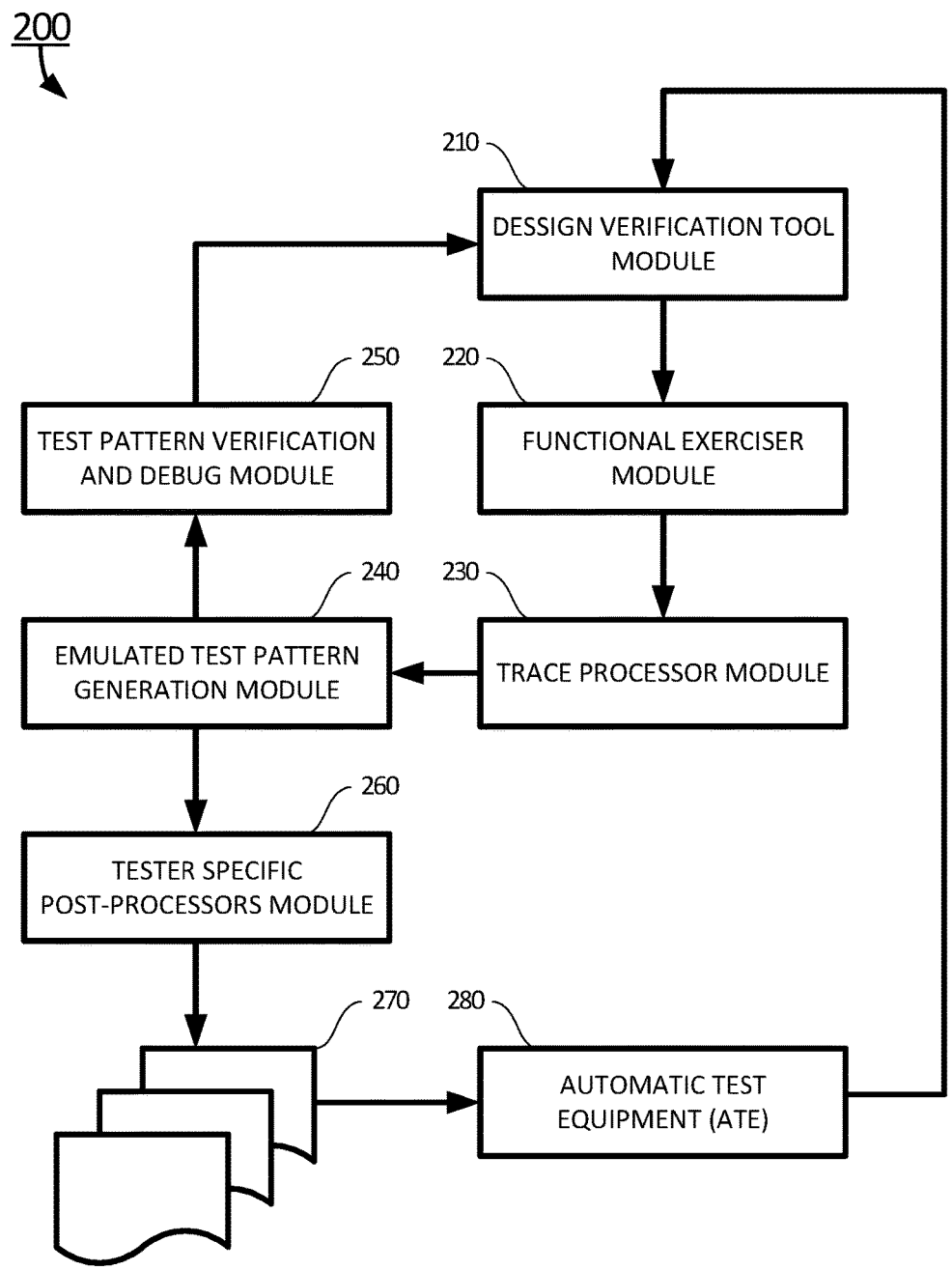
FIG. 2 is a structure block diagram of an automatic functional pattern test generation (FPTG) system for performing system functional test on a device and generation of functional traces according to certain exemplary embodiments of the present invention.

In certain embodiments, the computer system 100 may be connected to a functional test pattern generation (FTPG) system 200 where a device is been tested, as shown in FIG. 2. The FTPG system 200 may include a design verification tool module 210, a functional exerciser module 220, a trace processor module 230, an emulated test pattern generation module 240, a test pattern verification and debug module 250, and a tester specific post-processor module 260 of an automatic test equipment (ATE) system 280.

In one embodiment, a system designer may use an input terminal of a computer to connect to the design verification tool module 210 and use the design verification tool module 210 to generate verification sequences using high level system instruction to verify system function design. In another embodiment, the system designer may manually generate the verification sequences. In certain embodiments, a database containing system model, exerciser scripts, and configuration information parameters may be used to facilitate the generation of verification sequences.

In certain embodiments, a device under test may include an actual very large scale integrated (VLSI) chip, actual hardware module, or actual system. In other embodiments, the device under test may include device models of simulated devices, simulated modules, or simulated system.

In certain embodiments, the verification sequences may be executed by the functional exerciser module 220. In certain embodiments, the executing may include executing the verification sequences received at the functional exerciser module 220 of the FTPG system 200 against the actual hardware device to generate a number of hardware traces. In other embodiments, the executing may include executing the verification sequences received at the functional exerciser module 220 of the FTPG system 200 against a device model to verify simulation and to generate a number of simulated traces when actual hardware of the device is unavailable.

In certain embodiments, the functional exerciser module 220 may perform certain simulated designer functional tests to generate the traces. The simulated designer functional tests may include: logic built-in self-test (LBIST), automatic built-in self-test (ABIST), processor only exerciser (POE), elastic I/O interface (EI), I/O built-in self-test (IOBIST), PLL, and various custom tests.

In certain embodiments, the traces generated, both the hardware traces and the simulated traces, may be captured by the trace processor module 230, in an emulation compatible format. The trace processor module 230 may parse the traces captured, verify data integrity, and summarize statistics of the traces captured. The trace processor module 230 may extract all necessary information to generate functional emulated test patterns. The necessary information may include configuration files for chip initialization such as pervasive initialization, setup PLLs, array initialization, and chiplet initialization.

In certain embodiments, the trace processor module 230 may evaluate to determine a device test port and emulation mode being used, decode each of test commands and extract pertinent information for further processing, and process certain special comments and pass a certain processed special comments to test engineer for diagnostic support. The test commands may include instructions and data to load and exercise a functional built-in self-test (BIST) unit.

In certain embodiments, the trace processor module 230 may modify the traces to add custom information and additions not available in the traces. The additions may include mask data, delays, and special keyword commands, and performing test time execution and data volume optimization with input from an optimization parameters module of the FTPG system 200.

In one embodiment, the trace processor module 230 may receive certain specific generation parameters from the optimization parameters module to streamline, optimize, and customize the emulated test patterns.

In certain embodiments, the emulated pattern generator module 240 of the FTPG system 200 may generate a predetermined number of emulated test patterns. These emulated test patterns may include tester independent format 'streams' of data compatible with the device test port using output of the trace processor module 230.

In certain embodiments, the test pattern verification and debug module 250 is configured to verify and debug the emulated test patterns, and provide feedback to the design verification tool module 210.

In certain embodiments, the tester specific post-processor module 260 may process the emulated test patterns to generate functional test patterns 270 and specific post processors for each required test system platform or different ATE manufacturers.

In certain embodiments, the generating functional test patterns 270 may include: modifying the traces to add custom information and additions not available in the traces and the additions may include mask data, delays, and special keyword commands, and performing test time execution and data volume optimization with input from an optimization parameters module of the FTPG system 200.

In certain embodiments, the functional test patterns generated is in a corresponding pattern source format ready for compilation and execution on the device. These functional test patterns can also be imported to the simulation tool to be verified against the device model. The verification feedback loop can also be used to support the diagnostics process. In certain embodiments, these functional test patterns can also be used to support other than manufacturing final test, such as emission diagnostic tools, burn-in stress tools, etc.

Figure 3:
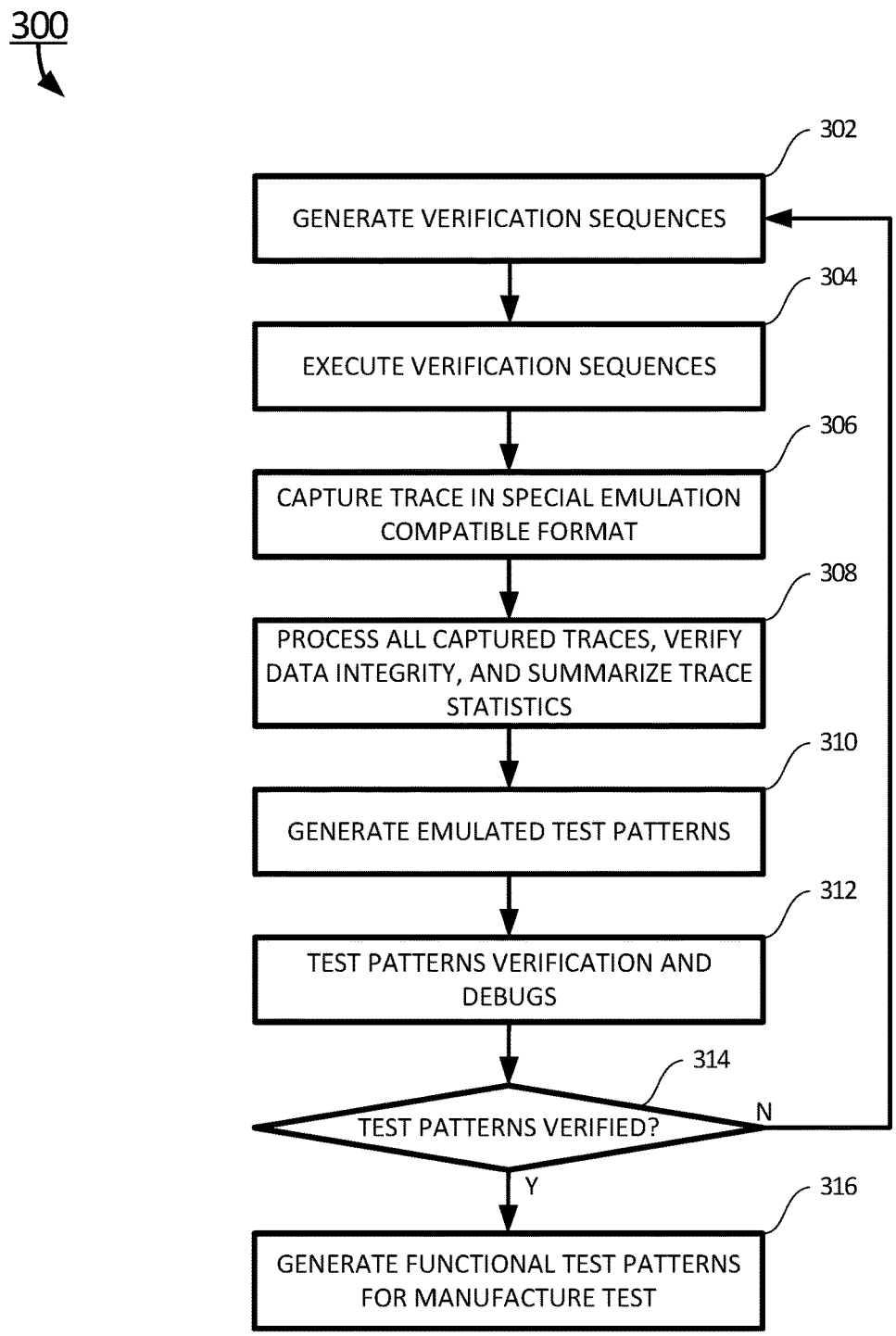
FIG. 3 is flow chart of an exemplary method of generating functional test patterns for diagnostics, characterization and manufacture test according to certain embodiments of the present invention.

Referring now to FIG. 3, a flow chart of an exemplary method 300 generating functional test patterns for diagnostics, characterization and manufacture test is shown according to certain embodiments of the present invention. In certain embodiments, the computer system 100 may be connected to an FTPG system 200 where a device is being tested, as shown in FIG. 2. The FTPG system 200 may include a design verification tool module 210, a functional exerciser module 220, a trace processor module 230, an emulated test pattern generation module 240, a test pattern verification and debug module 250, and a tester specific post-processor module 260 of an automatic test equipment (ATE) 280. In certain embodiments, a device under test may include an actual very large scale integrated (VLSI) chip, actual hardware module, or actual system. In other embodiments, the device under test may include device models of simulated devices, simulated modules, or simulated system.

At block 302, in one embodiment, a system designer may use an input terminal of a computer to connect to the design verification tool module 210 and use the design verification tool module 210 to generate verification sequences using high level system instruction to verify system function design. In another embodiment, the system designer may manually generate the verification sequences. In certain embodiments, a database containing system model, exerciser scripts, and configuration information parameters may be used to facilitate the generation of verification sequences.

At block 304, the verification sequences generated at block 302 are executed by the functional exerciser module 220. In certain embodiments, the executing may include executing the verification sequences received at the functional exerciser module 220 of the FTPG system 200 against the actual hardware device to generate a number of hardware traces. In other embodiments, the executing may include executing the verification sequences received at the functional exerciser module 220 of the FTPG system 200 against a device model to verify simulation and to generate a number of simulated traces when actual hardware of the device is unavailable.

The functional exerciser module 220 may perform certain simulated designer functional tests to generate the traces. The simulated designer functional tests may include: logic built-in self-test (LBIST), automatic built-in self-test (ABIST), processor only exerciser (POE), elastic I/O interface (EI), I/O built-in self-test (IOBIST), PLL, and various custom tests.

At block 306, the trace processor module 230 may capture the traces generated, both the hardware traces and the simulated traces. The traces captured by the trace processor module 230, are in an emulation compatible format.

At block 308, the trace processor module 230 may parse the traces captured, verify data integrity, and summarize statistics of the traces captured. The trace processor module 230 may extract all necessary information to generate functional emulated test patterns. The necessary information may include configuration files for chip initialization such as pervasive initialization, setup PLLs, array initialization, and chiplet initialization.

In certain embodiments, the trace processor module 230 may evaluate to determine a device test port and emulation mode being used, decode each of test commands and extract pertinent information for further processing, and process certain special comments and pass a certain processed special comments to test engineer for diagnostic support. The test commands may include instructions and data to load and exercise a functional built-in self-test (BIST) unit.

In certain embodiments, the trace processor module 230 may modify the traces to add custom information and additions not available in the traces. The additions may include mask data, delays, and special keyword commands, and performing test time execution and data volume optimization with input from an optimization parameters module of the FTPG system 200.

In certain embodiments, the trace processor module 230 receives certain specific generation parameters from the optimization parameters module to streamline, optimize, and customize the emulated test patterns.

At block 310, the emulated pattern generator module 240 of the FTPG system 200 may generate a predetermined number of emulated test patterns. These emulated test patterns may include tester independent format 'streams' of data compatible with the device test port using output of the trace processor module 230.

At block 312, in certain embodiments, the test pattern verification and debug module 250 is used to verify and debug the emulated test patterns generated at block 310.

At query block 314, the method 300 may check if all emulated test patterns are verified, and debugged. If all emulated test patterns are verified, and debugged, then the method 300 proceeds to block 316. Otherwise, the method 300 proceeds to block 302 to provide feedback to the design verification tool module 210. The system designer may make certain adjustment through the design verification tool module 210 to refine the verification sequences and go through the blocks 302-312 again.

At block 316, the tester specific post-processor module 260 may process the emulated test patterns to generate functional test patterns 270 and specific post processors for each required test system platform or different ATE manufacturers.

In certain embodiments, the generating functional test patterns 270 may include: modifying the traces to add custom information and additions not available in the traces and the additions may include mask data, delays, and special keyword commands, and performing test time execution and data volume optimization with input from an optimization parameters module of the FTPG system 200.

In another embodiment of the present invention, a computer system 100 for generating functional test patterns for diagnostics, characterization and manufacture test may include one or more processors 101A, 101B, and 101C, and a memory 102 for storing computer executable instructions for the computer system 100. When the computer executable instructions are executed at one of the processors, the computer executable instructions cause the computer system 100 to perform: receiving from a system designer, via a design verification tool module 210 of a functional test pattern generation (FTPG) system 200, a predetermined number of verification sequences configured to verify system functional design, executing the verification sequences received at a functional exerciser module 220 against a device to generate a number of traces, capturing the traces generated via a trace processor module 230 in an emulation compatible format, processing, via the trace processor module, the traces captured, the processing including parsing the traces captured, verifying data integrity of the traces captured, and summarizing statistics of the traces captured, generating, via an emulated pattern generator module 240, a predetermined number of emulated test patterns having tester independent format 'streams' of data compatible with a device test port based on output of the trace processor module 230, and processing, via a tester specific post-processor module 260 of the ATE system 280, the emulated test patterns to generate functional test patterns 270 using a tester specific post-processor module 260 of the ATE system 280.

In yet another embodiment of the present invention, a non-transitory computer readable storage medium may store computer executable instructions. When the computer executable instructions are executed by a processor of a computer system 100, the computer executable instructions cause the computer system 100 to perform: receiving from a system designer, via a design verification tool module 210 of a functional test pattern generation (FTPG) system 200, a predetermined number of verification sequences configured to verify system functional design, executing the verification sequences received at a functional exerciser module 220 against a device to generate a number of traces, capturing the traces generated via a trace processor module 230 in an emulation compatible format, processing, via the trace processor module 230, the traces captured, the processing including parsing the traces captured, verifying data integrity of the traces captured, and summarizing statistics of the traces captured, generating, via an emulated pattern generator module 240, a predetermined number of emulated test patterns having tester independent format 'streams' of data compatible with a device test port based on output of the trace processor module 230, and processing, via a tester specific post-processor module 260 of the ATE system 280, the emulated test patterns to generate functional test patterns 270 using a tester specific post-processor module 260 of the ATE system 280.

The present invention may be a computer system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system for generating functional test patterns for diagnostics, characterization and manufacture test comprising a memory having computer executable instructions; and a processor for executing the computer executable instructions, the computer executable instructions including:
   receiving from a system designer, via a design verification tool module of an automatic functional test pattern generation (FTPG) system, a plurality of verification sequences configured to test system functional design;
   executing the plurality of verification sequences received at a functional exerciser module of a functional test pattern generation (FTPG) system against a device to generate a plurality of traces;
   capturing the plurality of traces generated via a trace processor module of the FTPG system in an emulation compatible format;
   processing, via the trace processor module, the plurality of traces captured, the processing including parsing the plurality of traces captured, verifying data integrity of the plurality of traces captured, and summarizing statistics of the plurality of traces captured;
   generating, via an emulated pattern generator module of the FTPG system, a plurality of emulated test patterns having tester independent format streams of data compatible with a device test port, the generating based on output of the trace processor module; and
   processing, via a tester specific post-processor module of an automatic test equipment (ATE) system, the plurality of emulated test patterns to generate a plurality of functional test patterns using the tester specific post-processor module the ATE system.

2. The computer system of claim 1, wherein the plurality of verification sequences comprises a plurality of verification sequences automatically generated via the design verification tool module, and a plurality of verification sequences manually generated by the system designer.

3. The computer system of claim 1, wherein the executing comprises executing the plurality of verification sequences received at the functional exerciser module of the FTPG system against a device model to verify simulation and to generate the plurality of traces when hardware of the device is unavailable.

4. The computer system of claim 1, wherein the parsing comprises:
   evaluating to determine the device test port and emulation mode being used;
   decoding each of a plurality of test commands and extracting pertinent information for further processing; and
   processing a plurality of special comments and passing a plurality of processed special comments to test engineers for diagnostic support,
   wherein the plurality of test commands comprises instructions and data to load and exercise a functional built-in self-test (BIST) unit.

5. The computer system of claim 1, wherein the generating comprises:
   modifying the plurality of traces to add custom information and additions not available in the plurality of traces, wherein the additions comprise mask data, delays, and special keyword commands; and
   performing test time execution and data volume optimization with input from an optimization parameters module of the FTPG system.

6. The computer system of claim 5, wherein the generating comprises:
   receiving a plurality of specific generation parameters from the optimization parameters module to streamline, optimize, and customize the plurality of emulated test patterns.

7. The computer system of claim 6, wherein the FTPG system comprises a test pattern verification and debug module configured to
   verify and debug the plurality of emulated test patterns; and
   transmit failed emulated test patterns back to the design verification tool module for refinement.

8. A computer program product comprising a computer readable storage medium having program instructions embodied therewith, the program instructions executable by a processor located on a computer system to cause the processor to perform:
   receiving from a system designer, via a design verification tool module of an automatic functional test pattern generation (FTPG) system, a plurality of verification sequences configured to test system functional design;
   executing the plurality of verification sequences received at a functional exerciser module of the FTPG system against a device to generate a plurality of traces;
   capturing the plurality of traces generated via a trace processor module of the FTPG system in an emulation compatible format;
   processing, via the trace processor module, the plurality of traces captured, the processing including parsing the plurality of traces captured, verifying data integrity of the plurality of traces captured, and summarizing statistics of the plurality of traces captured;
   generating, via an emulated pattern generator module of the FTPG system, a plurality of emulated test patterns having tester independent format streams of data compatible with a device test port, the generating based on output of the trace processor module; and
   processing, via a tester specific post-processor module of an automatic test equipment (ATE) system, the plurality of emulated test patterns to generate a plurality of functional test patterns using a tester specific post-processor module of the ATE system.

9. The computer program product of claim 8, wherein the plurality of verification sequences comprises a plurality of verification sequences automatically generated via the design verification tool module, and a plurality of verification sequences manually generated by the system designer.

10. The computer program product of claim 8, wherein the executing comprises executing the plurality of verification sequences received at the functional exerciser module of the FTPG system against a device model to verify simulation and to generate the plurality of traces when hardware of the device is unavailable.

11. The computer program product of claim 8, wherein the parsing comprises:
   evaluating to determine the device test port and emulation mode being used;
   decoding each of a plurality of test commands and extracting pertinent information for further processing; and
   processing a plurality of special comments and passing a plurality of processed special comments to test engineers for diagnostic support,
   wherein the plurality of test commands comprises instructions and data to load and exercise a functional built-in self-test (BIST) unit.

12. The computer program product of claim 8, wherein the generating comprises one or more of:
   modifying the plurality of traces to add custom information and additions not available in the plurality of traces, wherein the additions comprise mask data, delays, and special keyword commands;
   performing test time execution and data volume optimization with input from an optimization parameters module of the FTPG system; and
   receiving a plurality of specific generation parameters from the optimization parameters module to streamline, optimize, and customize the plurality of emulated test patterns.

13. The computer program product of claim 12, wherein the FTPG system comprises a test pattern verification and debug module configured to
   verify and debug the plurality of emulated test patterns; and
   transmit failed emulated test patterns back to the design verification tool module for refinement.

* * * * *